(12) United States Patent
Mieczkowski et al.

(10) Patent No.: US 9,607,955 B2
(45) Date of Patent: Mar. 28, 2017

(54) CONTACT PAD

(75) Inventors: Van Mieczkowski, Apex, NC (US);
Zoltan Ring, Chapel Hill, NC (US);
Jason Gurganus, Raleigh, NC (US);
Helmut Hagleitner, Zebulon, NC (US)

(73) Assignee: Cree, Inc., Durham, NC (US)

( * ) Notice: Subject to any disclaimer, the term of this patent is extended or adjusted under 35 U.S.C. 154(b) by 1210 days.

(21) Appl. No.: 12/943,517

(22) Filed: Nov. 10, 2010

(65) Prior Publication Data

US 2012/0115319 A1 May 10, 2012

(51) Int. Cl.
*H01L 21/329* (2006.01)
*H01L 23/00* (2006.01)

(52) U.S. Cl.
CPC ............. *H01L 24/03* (2013.01); *H01L 24/05* (2013.01); *H01L 24/48* (2013.01); *H01L 2224/02166* (2013.01); *H01L 2224/04026* (2013.01); *H01L 2224/04042* (2013.01); *H01L 2224/05124* (2013.01); *H01L 2224/05155* (2013.01); *H01L 2224/05166* (2013.01); *H01L 2224/05169* (2013.01); *H01L 2224/05624* (2013.01); *H01L 2224/05644* (2013.01); *H01L 2224/05647* (2013.01); *H01L 2224/05687* (2013.01); *H01L 2224/48463* (2013.01); *H01L 2924/00014* (2013.01); *H01L 2924/0103* (2013.01); *H01L 2924/014* (2013.01); *H01L 2924/0105* (2013.01); *H01L 2924/01013* (2013.01); *H01L 2924/01023* (2013.01); *H01L 2924/01029* (2013.01); *H01L 2924/01033* (2013.01);

(Continued)

(58) Field of Classification Search
USPC .................................................. 438/577, 670
See application file for complete search history.

(56) References Cited

U.S. PATENT DOCUMENTS 4,788,082 A * 11/1988 Schmitt ..................... B22F 9/12
427/248.1
5,426,000 A * 6/1995 Labib ..................... C22C 47/04
428/366

(Continued)

FOREIGN PATENT DOCUMENTS

EP 1280210 A2 1/2003
JP S5846631 A 3/1983

(Continued)

OTHER PUBLICATIONS

International Search Report and Written Opinion for PCT/US2011/059542 mailed Jun. 25, 2012, 17 pages.

(Continued)

*Primary Examiner* — Fernando L Toledo
*Assistant Examiner* — Valerie N Newton
(74) *Attorney, Agent, or Firm* — Anthony J. Josephson

(57) ABSTRACT

The present disclosure relates to forming multi-layered contact pads for a semiconductor device, wherein the various layers of the contact pad are formed using one or more thin-film deposition processes, such as an evaporation process. Each contact pad includes an adhesion layer, which is formed over the device structure for the semiconductor device; a titanium nitride (TiN) barrier layer, which is formed over the adhesion layer; and an overlay layer, which is formed over the barrier layer. At least the titanium nitride (TiN) barrier layer is formed using an evaporation process.

15 Claims, 7 Drawing Sheets

(52) U.S. Cl.
CPC ............. *H01L 2924/01042* (2013.01); *H01L 2924/01047* (2013.01); *H01L 2924/01049* (2013.01); *H01L 2924/01059* (2013.01); *H01L 2924/01073* (2013.01); *H01L 2924/01074* (2013.01); *H01L 2924/01078* (2013.01); *H01L 2924/01079* (2013.01); *H01L 2924/04941* (2013.01); *H01L 2924/1033* (2013.01); *H01L 2924/10272* (2013.01); *H01L 2924/10329* (2013.01); *H01L 2924/12032* (2013.01); *H01L 2924/1301* (2013.01); *H01L 2924/1306* (2013.01)

(56) References Cited

U.S. PATENT DOCUMENTS

| | | | |
|---|---|---|---|
| 5,885,898 | A | 3/1999 | Kim et al. |
| 5,961,729 | A * | 10/1999 | Akari ........................... 134/1.1 |
| 6,074,960 | A * | 6/2000 | Lee ........................... C23F 1/28 257/E21.309 |
| 7,727,882 | B1 * | 6/2010 | Wu et al. ........................ 438/627 |
| 2003/0067369 | A1 * | 4/2003 | Nakano et al. ............... 333/193 |
| 2004/0171249 | A1 * | 9/2004 | Ahn et al. ..................... 438/637 |
| 2004/0253815 | A1 * | 12/2004 | Sun et al. ..................... 438/670 |
| 2005/0006759 | A1 | 1/2005 | Huang |
| 2007/0138648 | A1 | 6/2007 | Vinn et al. |
| 2008/0317947 | A1 * | 12/2008 | Coiffic ......................... 427/118 |
| 2009/0078966 | A1 | 3/2009 | Asai et al. |
| 2010/0140737 | A1 * | 6/2010 | Lin et al. ..................... 257/528 |

FOREIGN PATENT DOCUMENTS

| | | |
|---|---|---|
| JP | 59112654 A | 6/1984 |
| JP | S6135517 A | 2/1986 |
| JP | 62209835 A | 9/1987 |
| JP | S6351630 A | 3/1988 |
| JP | H04177764 A | 6/1992 |
| JP | H10135518 A | 5/1998 |
| JP | 2003069048 A | 3/2003 |
| JP | 2005277240 A | 10/2005 |

OTHER PUBLICATIONS

Ting, C.Y., "TIN formed by evaporation as a diffusion barrier between Al and Si," Journal of Vacuum Science and Technology, vol. 21, No. 1, May 1, 1982, pp. 14-18.
Ting, C.Y., "New structure for contact metallurgy," IBM Technical Disclosure Bulletin, vol. 25, No. 12, May 1983, pp. 6398-6399.
Aboelfotoh, M.O. et al., Schottky-barrier heights of Ti and TiSi2 on n-type and p-type Si(100). Physical Review B, vol. 34, No. 4, Aug. 15, 1986, pp. 2311-2318.
La Via, F. et al., "Structural and electrical characterisation of titanium and nickel silicide contacts on silicon carbide," Microelectronic Engineering, vol. 60, No. 1-2, Jan. 2002, pp. 269-282.
International Preliminary Report on Patentability for PCT/US2011/059542, mailed May 23, 2013, 11 pages.
Notice of Reason for Rejection for Japanese Patent Application No. 2013-538805, mailed Feb. 23, 2015, 5 pages.
Reason for Rejection for Japanese Patent Application No. 2013-538805, mailed Jan. 12, 2016, 4 pages.
Office Action and Search Report for Taiwanese Patent Application No. 100140973, issued Oct. 19, 2015, 9 pages.
Office Action and Search Report for Taiwanese Patent Application No. 100140973, issued Oct. 4, 2016, 9 pages.

* cited by examiner

CONTACT PAD

FIELD OF THE DISCLOSURE

The present disclosure relates to contact pads, and in particular to contact pads employed in semiconductor devices.

BACKGROUND

Contact pads in many semiconductor applications require a top layer that is formed from one type of material and a bottom layer that is formed from another type of material. The top layer is used for electrically connecting the semiconductor device to an external element, whereas the bottom layer is used for electrically connecting and mechanically attaching the contact pads to the underlying epitaxial structure of the semiconductor device. Unfortunately, the different materials that are used to form the top and bottom layers of the contact pads can adversely impact one another. For example, if the top layer is formed from aluminum (Al) and the bottom layer is formed from titanium (Ti), the aluminum (Al) of the top layer readily diffuses into the titanium (Ti) of the bottom layer at high fabrication and operating temperatures. Such diffusion leads to significant reliability issues with regard to the contact pads and the semiconductor device as a whole. To combat diffusion, designers may provide a barrier layer between the top and bottom layers of the contact pads. The material composition of the barrier layer is selected to prevent, or at least significantly inhibit, the diffusion of the material of the top layer into the material of the bottom layer, and vice versa.

The various layers of the contact pads are formed sequentially using thin-film deposition processes, such as sputtering and evaporative deposition processes. Given the relative ease of combining numerous elements and the nature of the chemical reaction during deposition, sputtering processes often produce a more effective barrier layer. However, sputtered layers do not lend themselves to lift-off processing where patterned masks are employed prior to depositing the metal layers and removed after the metal layers have been deposited to form contact pads with desired shapes and at desired locations. In particular, when lift-off processing is used in conjunction with a sputtering process, removal of the patterned mask and the portions of the metal layers that reside above the patterned mask is difficult. Further, the contact pads are left with residual tags and other artifacts that are undesirable. In contrast to sputtering processes, evaporative processes do lend themselves to lift-off processing, but have historically not provided barrier layers as effective as sputter processes.

Accordingly, there is a need for an effective barrier layer for contact pads in semiconductor devices. There is a further need for an effective barrier layer that can be reliably formed when lift-off processing is employed.

SUMMARY

The present disclosure relates to forming multi-layered contact pads for a semiconductor device, wherein the various layers of the contact pad are formed using one or more thin-film deposition processes, such as an evaporation process. Each contact pad includes an adhesion layer, which is formed over the device structure for the semiconductor device; a titanium nitride (TiN) barrier layer, which is formed over the adhesion layer; and an overlay layer, which is formed over the barrier layer. At least the titanium nitride (TiN) barrier layer is formed using an evaporation process. The evaporated titanium nitride (TiN) barrier layer provides an exceptional barrier that prevents, or at least substantially limits, the material that is used to form the overlay layer from diffusing into or through the adhesion layer during elevated temperatures associated with fabrication or operation.

In one embodiment, each successive layer of the contact pad is formed using an evaporation process. Accordingly, the adhesion layer is evaporatively formed over the device structure for the semiconductor device, the titanium nitride (TiN) barrier layer is evaporatively formed over the adhesion layer, and the overlay layer is evaporatively formed over the barrier layer. The contact pad may include additional layers below the adhesion layer or between any two of the adhesion, barrier, and overlay layers. Regardless of the particular embodiment, use of titanium nitride (TiN) for the barrier layer in combination with employing an evaporation process for forming the barrier layer, and perhaps other layers of the contact pad, allows fabrication of a high quality contact pad using a lift-off process.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
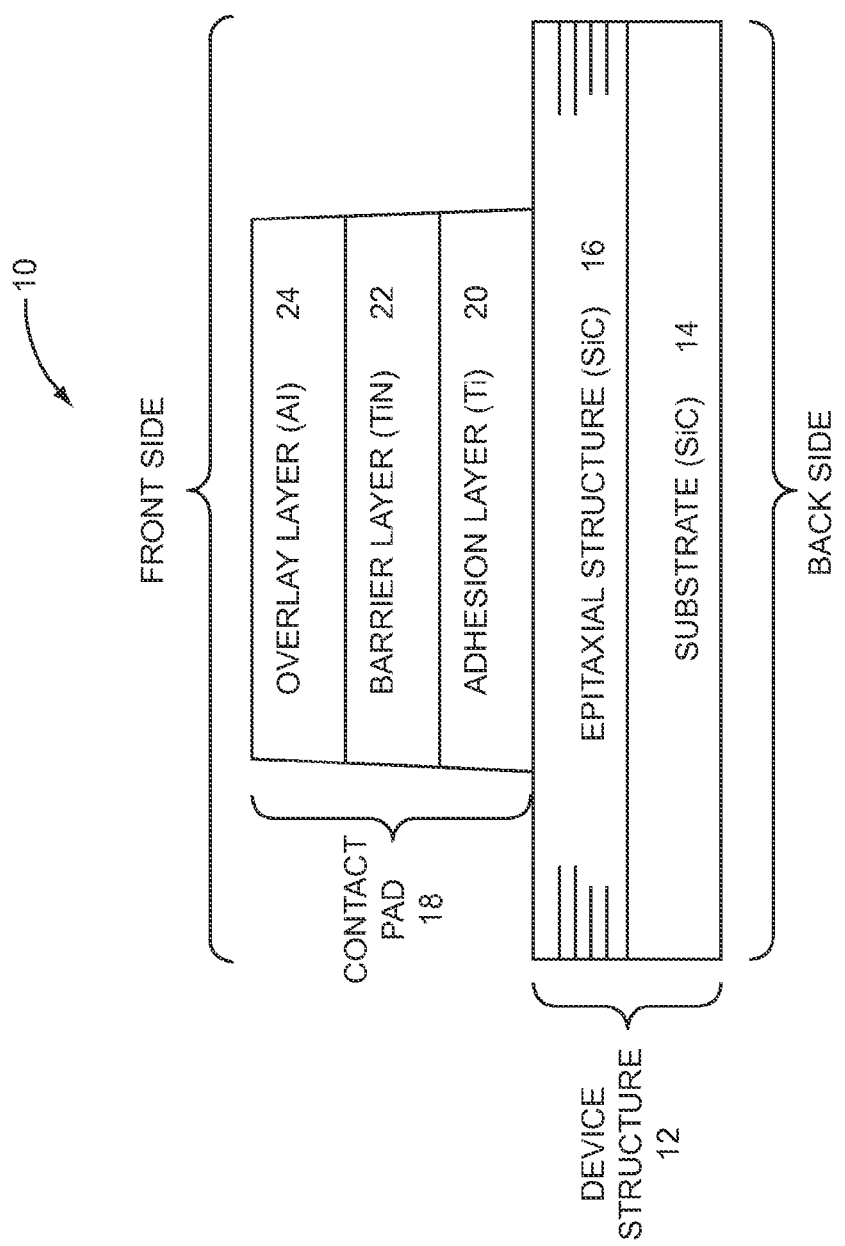
FIG. 1 is a block diagram of a semiconductor device with a contact pad according to one embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region or substrate is referred to as being "on" or extending "onto" another element, it can be directly on or extend directly onto the other element or intervening elements may also be present. It should also be understood that "on" should not suggest any particular orientation. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The following disclosure particularly highlights embodiments implanted in a silicon carbide (SiC) material system. However, the concepts provided herein extend to other material systems, such as the gallium nitride (GaN), gallium arsenide (GaAs), zinc oxide (ZnO) material systems, and the like. Further, reference to a particular compound is considered to include the primary compound as well as any ternary and quaternary compounds of the primary compound. For example, a reference to a gallium nitride-based compound or structure is considered to include gallium nitride (GaN) as well as any of its ternary and quaternary compounds, such as but not limited to aluminum (Al) and indium (In). As such, a gallium nitride-based compound or structure may include any combination of gallium nitride (GaN), aluminum gallium nitride (AlGaN), or indium gallium nitride (InGaN) layers. Compounds from different material systems may be included in given structure. Further, stating a particular layer or material is formed from a particular compound, such as titanium nitride (TiN), does not preclude the presence of other elements or compounds in that layer or material, but should be interpreted to at least include the option for the layer or material to also consist essentially of the compound.

In particular, the present disclosure relates to forming multi-layered contact pads for a semiconductor device wherein the various layers of the contact pad are formed using one or more thin-film deposition processes, such as an evaporation process. Each contact pad includes an adhesion layer, which is formed over the device structure for the semiconductor device; a titanium nitride (TiN) barrier layer, which is formed over the adhesion layer; and an overlay layer, which is formed over the barrier layer. At least the titanium nitride (TiN) barrier layer is formed using an evaporation process. The evaporated titanium nitride (TiN) barrier layer provides an exceptional barrier that prevents or substantially limits the material that is used to form the overlay layer from diffusing into or through the adhesion layer during elevated temperatures associated with fabrication or operation.

In one embodiment, each layer of the contact pad is formed using an evaporation process. Accordingly, the adhesion layer is evaporatively formed over the device structure for the semiconductor device, the titanium nitride (TiN) barrier layer is evaporatively formed over the adhesion layer, and the overlay layer is evaporatively formed over the barrier layer. The contact pad may include additional layers below the adhesion layer or between any two of the adhesion, barrier, and overlay layers. Regardless of the particular embodiment, use of titanium nitride (TiN) for the barrier layer in combination with employing an evaporation process for forming the barrier layer, and perhaps other layers of the contact pad, allows fabrication of a high quality contact pad using a lift-off process.

In general, deposition processes such as evaporation and sputtering processes are used to form thin films, or layers, of a desired material over a given surface. To generate multiple layers of differing materials, the respective layers may be sequentially deposited. For example, the adhesion, barrier, and overlay layers are sequentially deposited using an evaporative deposition process when forming the contact pads. A lift-off process, which is described below, is a technique for forming specific structures, such as contact pads having desired dimensions, from the deposited or otherwise provided layers. As such, lift-off processing is often provided in conjunction with deposition processes to form various aspects of a semiconductor device.

Typically, a lift-off process entails forming a removable mask over a surface of the device structure on which the contact pads are to be formed. The mask has openings that expose portions of the surface of the device structure. These exposed portions of the surface of the device structure correspond to the locations and base dimensions of the contact pads to be formed. Each layer of the contact pad is sequentially deposited over the mask, and notably, through the openings in the mask onto the exposed portions of the surface of the device structure. Once each layer for the contact pad is formed, the mask is dissolved and the deposited layers residing on or above the mask as well as any mask residue are readily removed from the surface of the device structure. As a result, the deposited layers are removed from, or lifted off of, the surface of the device structure everywhere except where the openings were provided in the removable mask. The desired contact pads remain on and securely attached to the formerly exposed surface of the device structure where the openings were provided in the mask.

As noted, an evaporation process is a thin film deposition process, which is used to form certain layers in a semiconductor device. In particular, an evaporation process entails evaporating the material or materials desired for a given layer in a vacuum. As the resulting vapor particles contact the surface on which the layer is to be applied, the vapor particles condense into a solid state to gradually form a layer of the desired material or materials. The thickness of the layer generally corresponds to the concentration of the vapor particles and the amount of time the surface is exposed to the vapor particles. Exemplary evaporation processes include electron-beam and resistive (or flash) evaporation processes.

An evaporation process is different than a sputtering process for depositing layers. Sputtering processes employ ionized gas molecules to displace atoms of a specific material. The displaced atoms bond at an atomic level to the exposed surface and create a layer on the exposed surface. As a general rule of thumb, sputtering processes do not lend themselves to lift-off processing, whereas evaporative processes are generally more compatible with lift-off processing.

With reference to FIG. 1, a semiconductor device 10 is illustrated according to one embodiment of the disclosure. The semiconductor device 10 includes a device structure 12 that is formed from a substrate 14 and an epitaxial structure 16, which may represent one or more semiconductor, metallic or dielectric layers. Typically, the epitaxial structure 16 alone or in combination with the substrate 14 provides the requisite epitaxial layer or layers required to form all or part of the active areas for one or more semiconductor devices, such as diodes, thyristors, and transistors, as will be appreciated by those skilled in the art. The device structure 12 is generally provided by a semiconductor wafer and is considered to have a front side and a back side, wherein the front side corresponds to the front, or top, side of the wafer and the back side corresponds to the back, or bottom, side of the wafer. The front side of the semiconductor device 10 is typically, but not always, the side of the wafer on which the epitaxial structure 16 resides, and thus on which the active portions of the semiconductor devices 10 are generally formed.

Certain portions of the semiconductor devices 10 that are formed in the epitaxial structure 16 generally need to be electrically connected to one or more metallic contact pads, such as contact pad 18. These portions that need a contact pad 18 may correspond to the anode and cathode of a diode or the source, gate, and drain of a field effect transistor (FET). Each contact pad 18 serves as a soldering or like connection point for bonding wires or the contact pads of other elements. Care should be taken to ensure that the bottom surface of the contact pad 18 provides a low resistivity and mechanically stable connection with the underlying portion of the epitaxial structure 16. The top portion of the contact pad 18 should provide a surface to which it is easy to solder or otherwise connect bonding wires or contact pads of other elements. Although not depicted, the contact pad 18 may also be formed on the back side of the device structure 12 in the same or different manner as that formed on the front side of the device structure 12.

As illustrated, the contact pad 18 has three primary layers: an adhesion layer 20, which resides over the epitaxial structure 16; a barrier layer 22, which resides over the adhesion layer 20; and an overlay layer 24, which resides over the barrier layer 22. Additional layers may be provided below or between these primary layers. The material for the adhesion layer 20 is usually selected based on its ability to provide a low resistance electrical and structurally sound mechanical connection to the epitaxial structure 16. The material for the overlay layer 24 is usually selected based on its ability to provide a good surface to which to solder or connect the bonding wires or contact pads of other elements or devices. The contact pad 18 may be used for ball or wedge bonds in a wirebonding process. Often, the materials used to form the adhesion layer 20 and the overlay layer 24 are different.

When employing a silicon carbide (SiC) material system for example, titanium (Ti) provides a good material for forming the adhesion layer 20 while aluminum (Al) is a good material for forming the overlay layer 24 of the contact pad 18. Titanium (Ti) has a high work function and bonds well to the silicon carbide-based epitaxial structure 16, while aluminum (Al) provides a relatively inexpensive, yet highly effective and robust surface for the contact pad 18. At high temperatures during manufacture or under operating conditions, the aluminum (Al) of one layer can diffuse into adjacent layers. If the aluminum (Al) of an aluminum (Al) overlay layer 24 were to diffuse into a titanium (Ti) adhesion layer 20 or through the adhesion layer into the epitaxial structure 16, performance and reliability of the contact pad 18 and the underlying semiconductor device may be significantly compromised.

The barrier layer 22 is provided between the adhesion layer 20 and the overlay layer 24 to prevent, or at least substantially limit, diffusion of the material used to form the overlay layer 24 into the adhesion layer 20. As such, the barrier layer 22 is formed from a material that resists diffusion from the material used to form the overlay layer 24. For the present disclosure, the adhesion layer 20, the barrier layer 22, and the overlay layer 24 may be formed using an evaporation process, which as noted above, allows the use of lift-off processing to fabricate the contact pad 18.

Applicants have discovered that a barrier layer 22 formed from evaporated titanium nitride (TiN) provides an unexpectedly good diffusion barrier between various metals, is relatively inexpensive, and lends itself to lift-off processing techniques, which are beneficial when forming the contact pads 18. To form the titanium nitride (TiN) barrier layer 22 using an evaporation process, titanium (Ti) is evaporated in the presence of nitrogen ($N_2$) in a vacuum. The titanium (Ti) and nitrogen ($N_2$) atoms collide and react with one another to form titanium nitride (TiN), which condenses into a solid state to form the barrier layer 22 upon coming into contact with a solid surface, such as the surface of the adhesion layer 20. In particular, the titanium (Ti) and nitrogen ($N_2$) react to form titanium nitride (TiN) and titanium (Ti) stuffed with diatomic (unreacted) nitrogen ($N_2$). It was further discovered that the scattering of atoms due to the background gas pressure from the nitrogen ($N_2$) injection during the deposition process significantly improves the coverage of the barrier layer 22. The scattering of the atoms may be further increased or altered by injection of one or more inert gases, such as argon (Ar) and krypton (Kr), during deposition and will still allow for lift-off processing.

When lift-off processing is desired, the use of a titanium nitride (TiN) barrier layer 22 has proven to be superior to layers formed predominantly from platinum (Pt), molybdenum (Mo), tungsten (W), and tantalum (Ta), especially when the overlay layer 24 is aluminum (Al) and the adhesion layer 20 is titanium (Ti). However, a titanium nitride (TiN) barrier layer 22 provides an excellent barrier for embodiments where the overlay layer 24 is gold (Au) and the adhesion layer 20 is titanium (Ti) or Nickel (Ni). Additional non-limiting examples include using a titanium nitride (TiN) barrier layer 22, adhesion layers 20 formed from aluminum (Al), platinum (Pt), or nickel (Ni), and overlay layers 24 formed from gold (Au) or copper (Cu), in silicon carbide (SiC), gallium nitride (GaN), or aluminum nitride (AlN) based devices.

Based on atomic count (not atomic weight), the ratio of titanium (Ti) to nitrogen ($N_2$) in the titanium nitride (TiN) barrier layer 22 may range from 1:50 to 70:50, wherein in one embodiment the ratio of titanium (Ti) to nitrogen ($N_2$) is 10:50 to 40:50. Using smaller amounts of nitrogen ($N_2$) during the evaporation process results in the titanium nitride (TiN) barrier layer 22 being metallic with a bulk resistivity similar to that of titanium (Ti). Using larger amounts of nitrogen ($N_2$) during the evaporation process tends to turn the resultant titanium nitride (TiN) barrier layer 22 more transparent and increases the bulk resistivity as well as the chemical inertness of the layer.

Additionally, the barrier layer 22 may be graded, such that the ratio of titanium (Ti) to nitrogen ($N_2$) changes in the direction of deposition through all or part of the barrier layer 22. For example, the initial (lower) portion of the barrier layer 22 that initially forms on the adhesion layer 20 may be substantially formed of titanium and does not, at least intentionally, include nitrogen ($N_2$). After the barrier layer 22 reaches a first thickness, nitrogen ($N_2$) may be introduced and may be gradually increased until a desired ratio of titanium (Ti) to nitrogen ($N_2$) is reached at a second thickness. The result is a second portion of the barrier layer 22 that includes a graduated ratio of titanium (Ti) to nitrogen ($N_2$). This desired ratio of titanium (Ti) to nitrogen ($N_2$) may be maintained until the barrier layer 22 reaches a third thickness to create a third portion of the barrier layer 22 where the ratio of titanium (Ti) to nitrogen ($N_2$) is substantially uniform. Once the third thickness is reached, the ratio of titanium (Ti) to nitrogen ($N_2$) may be gradually decreased wherein at a fourth thickness, no nitrogen ($N_2$) is being introduced. As such after the fourth thickness is reached, the barrier layer 22 returns to being substantially formed from of titanium (Ti) and may not, at least intentionally, include nitrogen ($N_2$). At this point, the overly layer 24 is formed.

The above described grading strategy may be provided once or may be repeated multiple times for a given barrier layer 22. As those skilled in the art will appreciate, other grading strategies may be employed instead of or in addition to the one disclosed above. The multiple-step grading strategy disclosed above is only exemplary and is selected to illustrate various types of grading that may be employed alone or in combination with one another. For example, the barrier layer 22 may include alternating layers of primarily titanium (Ti) with layers of titanium nitride (TiN) or may include alternating layers of titanium nitride (TiN) that have different ratios of titanium (Ti) to nitrogen ($N_2$).

Figure 2A:
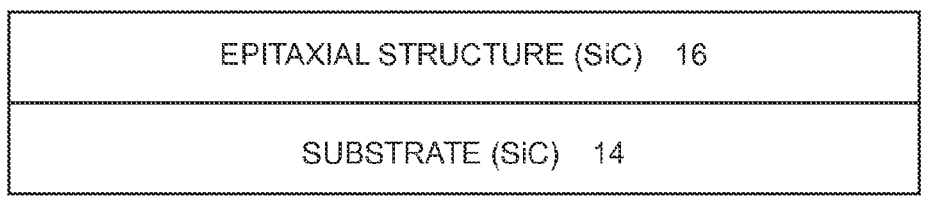
FIGS. 2A through 2K illustrate selected steps of a process for fabricating a semiconductor device having a contact pad according to one embodiment of the disclosure.

In association with FIGS. 2A through 2K, the following description describes an exemplary and non-limiting fabrication process for forming a semiconductor device 10 having at least one contact pad 18. Initially and as illustrated in FIG. 2A, a wafer is provided to include a substrate 14 and an epitaxial structure 16. In this example, assume the fabrication process is provided for a silicon carbide (SiC) material system. However, the process steps are equally applicable to other material systems. Further assume that the device being fabricated is a vertically-integrated Schottky diode designed for high power applications, and the single or multiple layer epitaxial structure 16 has been processed, doped, and manipulated as necessary to form the active portions of the Schottky diode. Although a Schottky diode is provided as an example, the process of forming a contact pad 18 for the Schottky diode is equally applicable to other types of passive and active devices, such as but not limited to transistors, thyristors, resistors, and capacitors.

Figure 2B:
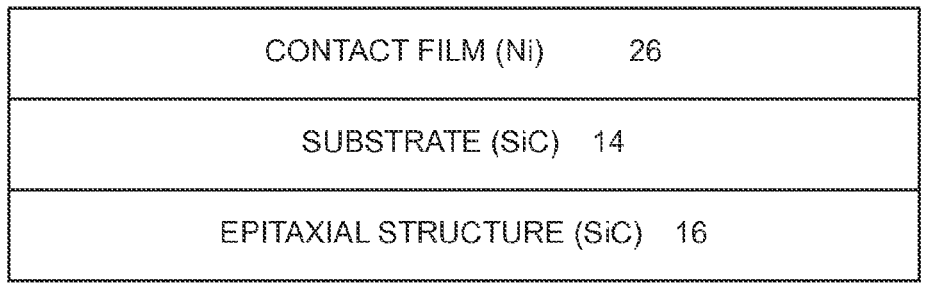
Figure 2C:
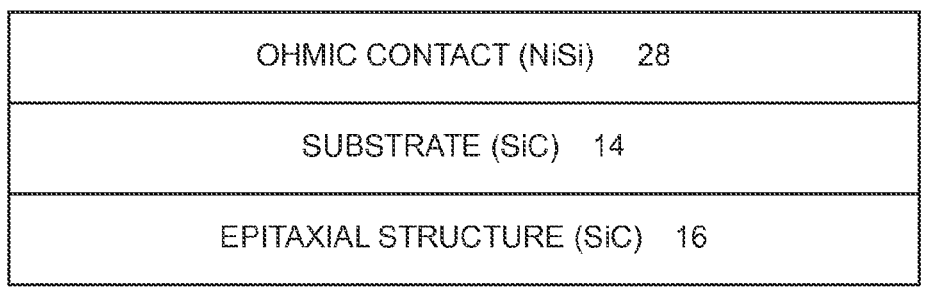

Since the described example is a vertically-integrated Schottky diode, contacts are ultimately required on the top and bottom of the device. As the illustrated process progresses, the contact pad 18 is formed first on the front side of the semiconductor device 10 while a back side contact structure is subsequently formed on the back side of the semiconductor device 10. However, prior to forming the contact pad 18 on the front side, the back side of the substrate 14 is prepared for forming the back side contact. As illustrated in FIG. 2B, a contact film 26 of nickel (Ni) is formed using a sputtering process. Once formed, the nickel contact film 26 is annealed to form an ohmic contact 28 of nickel silicide (NiSi) (FIG. 2C). In the illustrated embodiment, the ohmic contact 28 is around about 800 angstroms (Å) after annealing; however, exemplary and non-limiting ranges for the thickness of the ohmic contact 28 may be 100 to 3000 Å and 600 to 1000 Å.

Figure 2D:
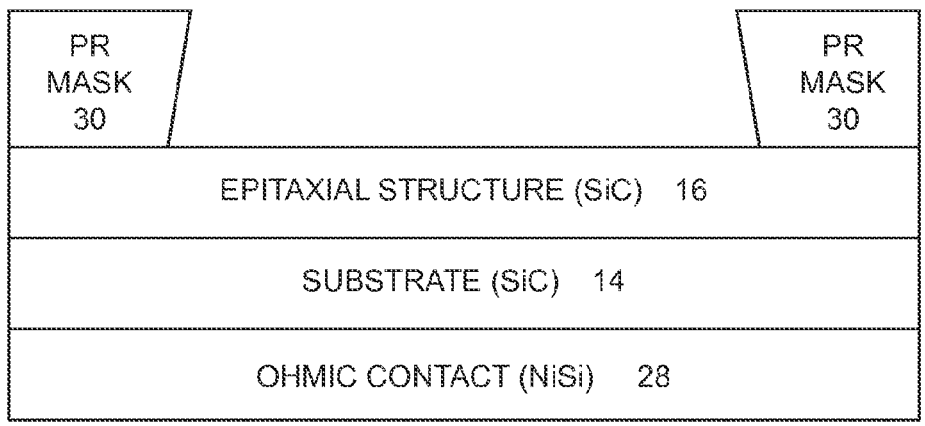

Once the ohmic contact 28 is formed, processing on the front side of the wafer resumes. In particular, a photo resist (PR) film is applied over the surface of the epitaxial structure 16 and etched to form a PR mask 30, which includes openings through which a portion of the epitaxial structure 16 is exposed, as illustrated in FIG. 2D. These exposed portions of the surface of the epitaxial structure 16 correspond to the locations and base dimensions of the contact pads 18 to be formed.

Figure 2E:
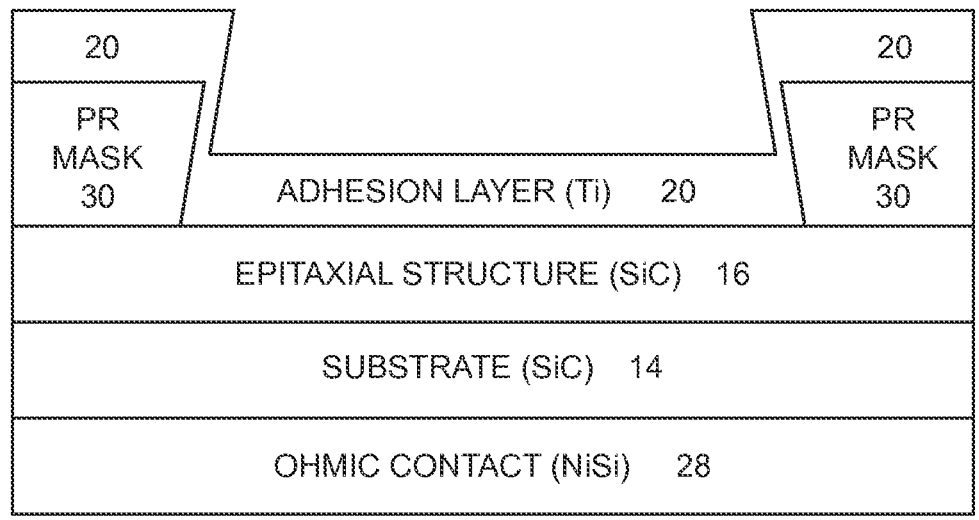
Figure 2F:
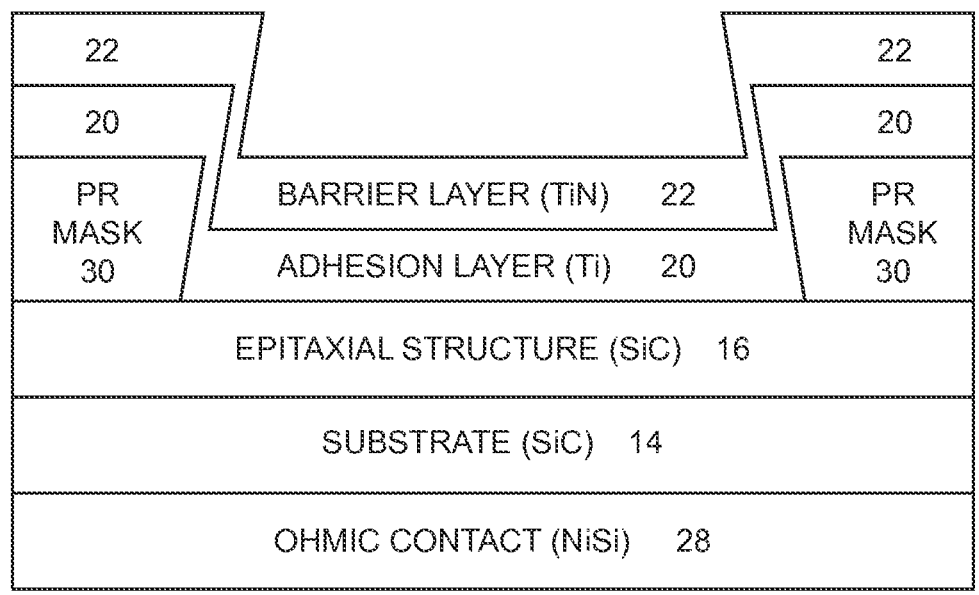
Figure 2G:
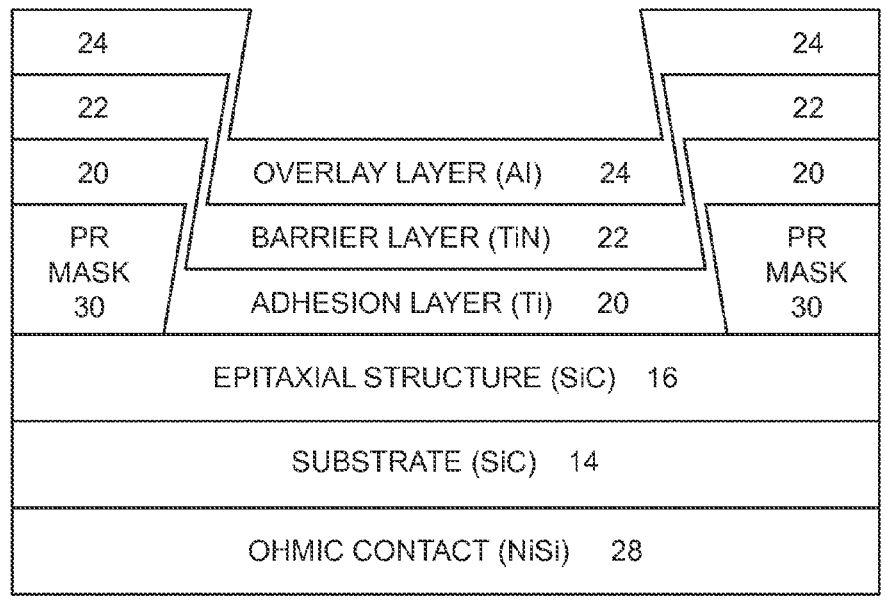

As illustrated in FIG. 2E, an adhesion layer 20 of titanium (Ti) is deposited over the PR mask 30 and through the openings in the PR mask 30 onto the exposed portions of the surface of the epitaxial structure 16. As illustrated in FIG. 2F, a barrier layer 22 of titanium nitride (TiN) is subsequently deposited over the entire surface of the adhesion layer 20, including the surfaces that reside over the remaining portions of the PR mask 30 and the formerly exposed portions of the surface of the epitaxial structure 16. As illustrated in FIG. 2G, an overlay layer 24 of aluminum (Al) is subsequently deposited over the entire surface of the barrier layer 22, including the surfaces that reside over the remaining portions of the PR mask 30 and the formerly exposed portions of the surface of the epitaxial structure 16. In the illustrated embodiment, the adhesion layer 20, the barrier layer 22, the overlay layer 24 and any desired intermediate layers (not shown) are deposited using evaporative processes to allow for the forthcoming lift-off of the portions of these layers that reside over the remaining portions of the PR mask 30.

Figure 2H:
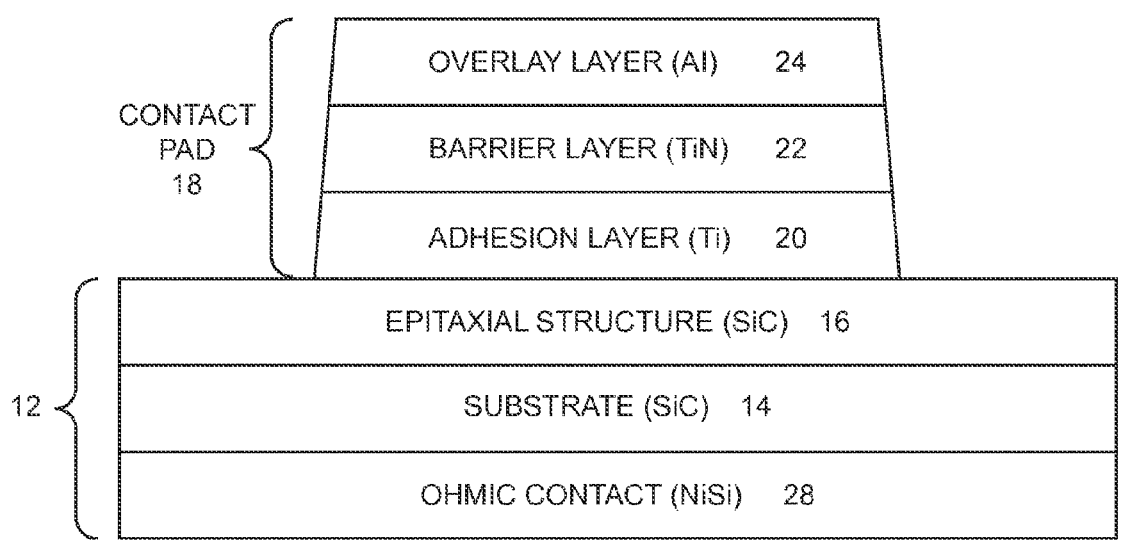

Once the desired layers for the contact pad 18 are deposited, the PR mask 30 is exposed to a solvent, which is capable of dissolving the PR mask 30. For example, the wafer may be submerged in a bath of N-methyl pyrolidone (NMP), which is a known solvent for the PR mask 30. As the remaining portions of the PR mask 30 are dissolved, the stacked layers that reside over the remaining portions of the PR mask 30 are released, or lifted off. The wafer is then subjected to a high pressure wash to remove the released portions of the layers and any residue of the dissolved PR mask 30. The unreleased portions of the layers that were formed in the openings of the PR mask 30 remain on and securely attached to the epitaxial structure 16 to form the contact pad 18, as illustrated in FIG. 2H.

For the illustrated embodiment, which provides a Schottky diode, the adhesion layer 20 may act as the Schottky layer wherein a metal-semiconductor junction is provided at a junction of the adhesion (Schottky) layer 20 and the epitaxial structure 16. For a Schottky diode configuration, the substrate 14, and and in certain applications the epitaxial structure 16, may be doped with N- or P-type material as necessary to achieve desired performance characteristics and parameters. For the illustrated embodiment, the substrate 14 is doped with an N-type material at concentrations between about $1\times10^{14}$ and $1\times10^{19}$ cm$^{-1}$. The adhesion layer 20 is formed from titanium (Ti) and is around about 1000 Å thick; however, exemplary and non-limiting ranges for the thickness of the adhesion layer 20 may be 100 to 5000 angstroms (Å) and 500 to 1500 Å.

The barrier layer 22 is formed from titanium nitride (TiN) and is around about 800 Å thick; however, exemplary and non-limiting ranges for the thickness of the barrier layer 22 may be 50 to 10,000 Å and 100 to 1000 Å. Notably, the barrier layer 22 may be graded and the like, as described above. The overlay layer 24 is formed from aluminum (Al) and is around about 40,000 Å thick; however, exemplary and non-limiting ranges for the thickness of the overlay layer 24 may be 10,000 to 100,000 Å and 30,000 to 60,000 Å. While these materials and thicknesses are specifically provided, the disclosure and claims are not limited thereto.

Figure 2I:
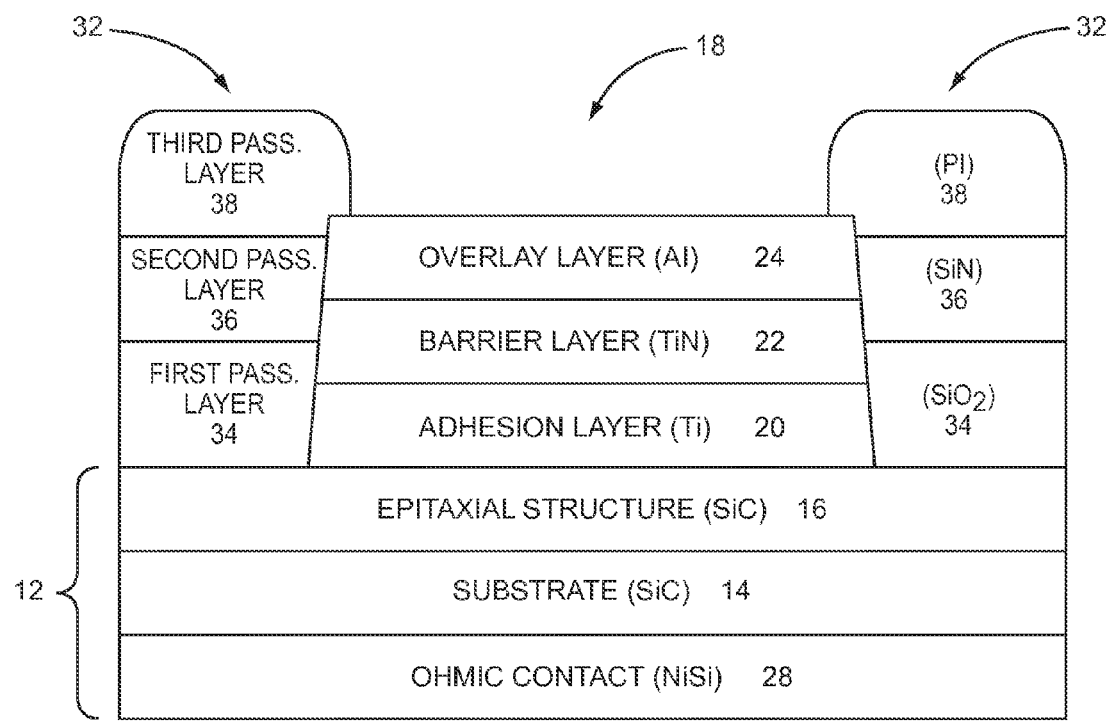

Next, a passivation structure 32 may be formed about the contact pad 18 to protect the contact pad 18 and the underlying epitaxial structure 16 from moisture or other environmental elements, as illustrated in FIG. 2I. While passivation structures 32 may take various forms and may be formed from any suitable material, the illustrated passivation structures 32 are formed from a first passivation layer 34 of silicon dioxide ($SiO_2$), silicon nitride (SiN), and/or a polyimide (PI), a second passivation layer 36 of silicon dioxide ($SiO_2$), silicon nitride (SiN), and/or a polyimide (PI), and a third and final passivation layer 38 formed from silicon dioxide ($SiO_2$), silicon nitride (SiN), and/or a polyimide (PI). A polyimide (PI) is a polymer of imide monomers. At this point, the contact pad 18 is formed and effectively sealed with the surrounding passivation structure 32, and the process now turns to building a contact on the back side of the wafer.

Figure 2J:
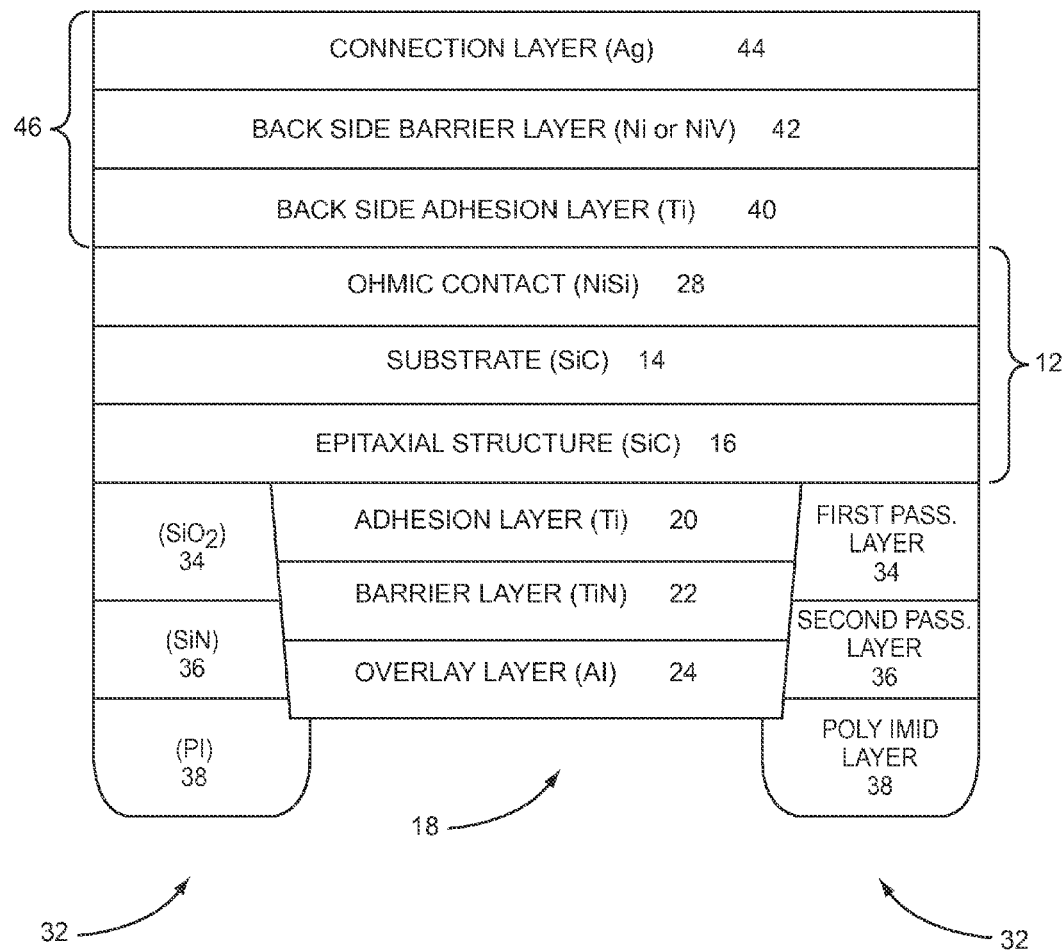

With reference to FIG. 2J, sequential deposition of at least a back side adhesion layer 40, a back side barrier layer 42, and a connection layer 44 on the ohmic contact 28 is used to form the back side contact layer structure 46. These layers may be provided through sputtering or evaporation deposition. For the illustrated embodiment, the back side adhesion layer 40 is formed from evaporated titanium (Ti) and is around about 800 Å thick; however, exemplary and non-limiting ranges for the thickness of the back side adhesion layer 40 may be 100 to 5000 (Å) and 500 to 1500 Å. The back side barrier layer 42 is formed from nickel (Ni) or nickel vanadium (NiV) and is around about 4000 Å thick; however, exemplary and non-limiting ranges for the thickness of the back side barrier layer 42 may be 500 to 10,000 Å and 2000 to 8000 Å. The connection layer 44 is formed from silver (Ag) and is around about 2000 Å thick; however, exemplary and non-limiting ranges for the thickness of the connection layer 44 may be 2000 to 15,000 angstroms (Å) and 6000 to 10,000 Å. While these materials and thicknesses are specifically provided, the disclosure and claims are not limited thereto.

Figure 2K:
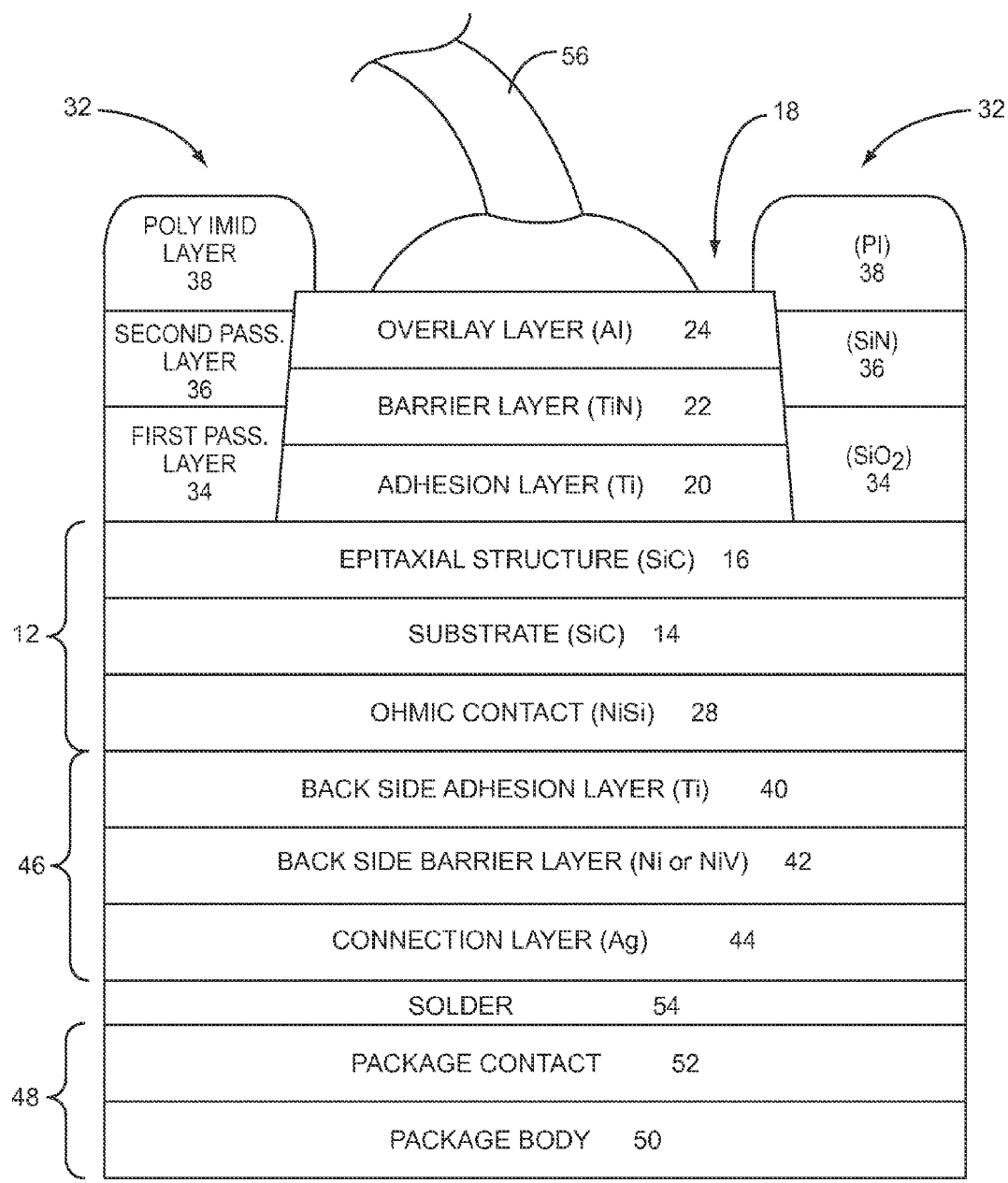

As illustrated in FIG. 2K, the semiconductor structure 10, which is a vertically-integrated Schottky diode in this example, can be soldered or otherwise connected to a package 48. In particular, the package 48 may include a package body 50 that provides a package contact 52. With solder 54, the connection layer 44 is directly soldered to the package contact 52. Further, a bonding wire 56 may be soldered to or otherwise connected to the overlay layer 24 of the contact pad 18.

Those skilled in the art will recognize improvements and modifications to the embodiments of the present disclosure. All such improvements and modifications are considered within the scope of the concepts disclosed herein and the claims that follow.

What is claimed is:

1. A method comprising:
   providing a semiconductor structure comprising a first surface;
   providing an adhesion layer on at least one select area of the first surface;
   providing a barrier layer of titanium nitride on the adhesion layer using an evaporation process, wherein the evaporation process comprises:
   creating a vacuum about the semiconductor structure; and
   after the adhesion layer is provided, evaporating titanium and injecting both nitrogen and an inert gas into the vacuum as the titanium is being evaporated such that the barrier layer of titanium nitride forms over the adhesion layer during injection of the nitrogen and the inert gas;
   providing an overlay layer on the barrier layer, wherein a contact pad comprises the adhesion layer, the barrier layer, and the overlay layer.

2. The method of claim 1 wherein the overlay layer comprises aluminum.

3. The method of claim 2 wherein the overlay layer comprises titanium.

4. The method of claim 1 wherein:
   prior to forming the adhesion layer, the barrier layer, and the overlay layer, forming on the first surface a removable mask having an opening that exposes the at least one select area on the first surface; and
   after the adhesion layer, the barrier layer, and the overlay layer are formed, removing the removable mask such that portions of the adhesion layer, the barrier layer, and the overlay layer that do not reside over the at least one select area on the first surface are removed with the removable mask, and the contact pad remains.

5. The method of claim 4 wherein the overlay layer comprises aluminum, and the adhesion layer comprises titanium.

6. The method of claim 1 wherein the barrier layer consists essentially of titanium nitride.

7. The method of claim 1 wherein throughout at least one portion of the barrier layer a ratio of titanium to nitrogen is substantially continuously varied to provide a graded portion in the barrier layer.

8. The method of claim 1 wherein the overlay layer consists essentially of aluminum.

9. The method of claim 1 wherein the semiconductor structure is used to form a Schottky diode having the contact pad, and the adhesion layer provides a Schottky layer such that a metal-semiconductor junction is formed at a junction of the adhesion layer and the first surface.

10. The method of claim 1 wherein the semiconductor structure is used to form a Schottky diode having the contact pad, and the adhesion layer provides a Schottky layer such that a metal-semiconductor junction is formed at a junction of the adhesion layer and the first surface.

11. The method of claim 1 wherein the overlay layer comprises aluminum, the adhesion layer comprises titanium, the barrier layer is formed directly on the adhesion layer, and the overlay layer is formed directly on the barrier layer.

12. The method of claim 1 wherein the semiconductor structure is formed from a silicon carbide material system.

13. The method of claim 1 wherein the overlay layer comprises one of a group consisting of aluminum, gold, and copper and the adhesion layer comprises one of a group consisting of aluminum, titanium, platinum, and nickel.

14. The method of claim 1 wherein the barrier layer is between about 100 and 5000 angstroms thick.

15. The method of claim 1 wherein the barrier layer is between about 500 and 1500 angstroms thick.

* * * * *